United States Patent
Linkewitsch et al.

(10) Patent No.: US 10,554,214 B2
(45) Date of Patent: Feb. 4, 2020

(54) EVALUATION CIRCUITRY

(71) Applicant: SOCIONEXT INC., Yokohama-shi, Kanagawa (JP)

(72) Inventors: Niklas Linkewitsch, Braunschweig (DE); Charles Joseph Dedic, London (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/243,994

(22) Filed: Jan. 9, 2019

(65) Prior Publication Data
US 2019/0229740 A1   Jul. 25, 2019

(30) Foreign Application Priority Data

Jan. 19, 2018   (EP) .................................... 18152580

(51) Int. Cl.
*H03M 1/06*   (2006.01)
*H03M 1/10*   (2006.01)

(52) U.S. Cl.
CPC ....... *H03M 1/0612* (2013.01); *H03M 1/1071* (2013.01)

(58) Field of Classification Search
CPC .... H03M 1/0612; H03M 1/1071; H03M 1/06; H03M 1/207
USPC ....................................................... 341/118
See application file for complete search history.

(56) References Cited

U.S. PATENT DOCUMENTS

| | | | |
|---|---|---|---|
| 4,298,942 A | 11/1981 | Lee | |
| 5,418,660 A | 5/1995 | Sato et al. | |
| 7,343,016 B2 * | 3/2008 | Kim | G10K 11/178 381/71.1 |
| 7,609,759 B2 * | 10/2009 | Raz | H03F 1/3229 375/229 |
| 2002/0000842 A1 | 1/2002 | Ando et al. | |
| 2004/0037430 A1 * | 2/2004 | Kim | G10K 11/178 381/71.8 |
| 2005/0283330 A1 | 12/2005 | Laraia et al. | |
| 2010/0082278 A1 | 4/2010 | Srinivasan et al. | |
| 2013/0113647 A1 * | 5/2013 | Sentelle | G01S 13/32 342/22 |

(Continued)

OTHER PUBLICATIONS

Extended European Search Report, European Patent Application No. 18152580.9, dated Jul. 26, 2018.

*Primary Examiner* — Jean B Jeanglaude
(74) *Attorney, Agent, or Firm* — Arent Fox LLP (57) ABSTRACT

A non-linearity evaluation circuit for use with a signal generator having at least a partly non-linear operation. The non-linearity evaluation circuit may include a detection unit operable to detect a given amplitude attribute in a target signal generated by the signal generator, a time position of the amplitude attribute in the target signal defining a time location of a snapshot time window relative to the target signal, a part of the target signal occupying the snapshot time window being a corresponding signal snapshot, and a presence of the given amplitude attribute indicating that the signal snapshot includes noise due to the non-linear operation of the signal generator. The non-linearity evaluation circuit may further include a controller operable to analyse the signal snapshot rather than a larger part of the target signal and to evaluate the non-linear characteristics of the operation of the signal generator based on the analysis.

15 Claims, 5 Drawing Sheets

(56) References Cited

U.S. PATENT DOCUMENTS

2014/0161271 A1\* 6/2014 Teranishi ................ H04R 5/04
381/71.7
2017/0004844 A1 1/2017 Short et al.

\* cited by examiner

EVALUATION CIRCUITRY

CROSS-REFERENCE TO RELATED APPLICATION

This application claims priority from European Patent Application No. 18152580.9 filed Jan. 19, 2018. The entire contents of the prior application are incorporated herein by reference.

The present invention relates to an evaluation circuit and methods. Such circuitry may be or form part of an integrated circuit.

Evaluation circuitry may be used with a signal generator, converter or processor in which at least part of the operation is non-linear. For example, the signal generator may be an analogue-to-digital converter (ADC) and the signal to be evaluated may be its output digital signal. The non-linear operation in the example of an ADC may result in noise (an error or distortion) in the output digital signal, such that the analogue input signal is not accurately converted. Non-linearity in such signal generators (e.g. which convert an input signal to an output signal, i.e. converters) may manifest itself particularly at the peaks of the output signal. In extreme cases the output signal may be cut off flat or 'clipped'. Such distortion is commonly referred to as 'clipping'.

Non-linearity can cause errors in the generated output signal and/or in further processing which uses the signal. It is therefore desirable to evaluate such non-linearity. Furthermore, it may be desirable to compensate for or correct such non linearity.

According to an embodiment of an aspect there is provided a non-linearity evaluation circuit for use with a signal generator having at least partly non-linear operation, the non-linearity evaluation circuit comprising: a detection unit operable to detect a given amplitude attribute in a target signal generated by the signal generator, the time position of the amplitude attribute in the target signal defining the time location of a snapshot time window relative to the target signal, the part of the target signal occupying the snapshot time window being a corresponding signal snapshot, and the presence of the given amplitude attribute indicating that the signal snapshot includes noise due to the non-linear operation of the signal generator and a controller operable to analyse the signal snapshot rather than a larger part of the target signal and to evaluate the non-linear characteristics of the operation of the signal generator based on the analysis.

Accordingly, the analysis of the controller may be limited to the signal snapshot, which corresponds to the amplitude attribute, and analysis of a larger part of the target signal is not performed. The required processing by the controller may therefore be reduced and the efficiency of the non-linear evaluation may be improved.

The given amplitude attribute may comprise an amplitude peak or an amplitude trough. Alternatively or additionally, the given amplitude attribute may comprise a given amplitude signature or amplitude pattern. Alternatively or additionally still, the amplitude attribute may occur within a given range of amplitude values. The amplitude attribute may therefore be any determined amplitude characteristic of the target signal.

The controller may preferably be operable to control a time relationship between the time location of the snapshot time window and the time position of the amplitude attribute in the target signal. Furthermore, the controller may be operable to control the time relationship such that the snapshot time window contains the amplitude attribute, preferably in a middle section of the snapshot time window. Accordingly, the controller may cause the location of the snapshot window to coincide with the amplitude attribute, such that the amplitude attribute is contained within the signal snapshot. The amplitude attribute may preferably be located in the centre of the snapshot window. In a preferred embodiment, the controller may be operable to control the size of the snapshot time window.

It may be preferable for the controller to be operable in the analysis to perform spectral analysis on the signal snapshot, rather than over the larger part of the target signal, so as to evaluate said non-linear characteristics. That is, the non-linearity may be evaluated by performing spectral analysis which is limited to the portion of the target signal contained in the signal snapshot and comprises the amplitude attribute. Furthermore, the controller may be operable to perform the spectral analysis over a fraction of the input data which is selected based on its features of its waveform (such as, for example, peaks) rather than over arbitrary data selected by a repetitively imposed timing scheme.

It may be preferable for the controller to be operable to perform the spectral analysis over a given frequency range rather than over a larger frequency range. The given frequency range may be a range over which energy in the resultant spectrum is indicative of the noise in the target signal due to the non-linear operation of the signal generator. The spectral analysis may therefore be limited to a frequency range at which noise due to the non-linear operation is likely to be found, and corresponding to the signal snapshot containing the amplitude attribute.

In a preferred embodiment the target signal has a signal bandwidth of $f_{MAX}$, where $f_{MAX} < fs/2$, and where fs is a sampling frequency based on which the signal generator generated the target signal; and the given frequency range is between $f_{MAX}$ and fs/2. Furthermore, $f_{MAX}$ and fs may be defined such that $(fs/2 - f_{MAX}) > fs/20$; and/or the given frequency range is between $f_{MAX}$ and $X \cdot f_{MAX}$, where $X \cdot f_{MAX} < fs/2$, and where $X > 1$; and/or the given frequency range is a subrange of the range between $f_{MAX}$ and fs/2.

The non-linearity evaluation circuitry may further comprise a snapshot memory operable to store a plurality of said signal snapshots, wherein the controller may be operable to perform spectral analysis on each of the stored signal snapshots to obtain a plurality of spectral results, to determine an average spectral result from the plurality of spectral results, and to evaluate said non-linear characteristics based on the average spectral result. The snapshot memory may be further operable to store, a plurality of average spectral results; and the controller may be operable to evaluate said non-linear characteristics based on the plurality of average spectral results. As well as storing signal snapshots and average spectral results, it may be considered that the snapshot memory is operable to update and store such data.

It may be preferable for the controller to be operable, based on the analysis of the signal snapshot, to output one or more candidate coefficients which, when applied to the signal snapshot or to a corresponding part of a source signal of the signal generator based on which the target signal was generated, would reduce noise present in the signal snapshot due to the non-linear operation of the signal generator. Noise caused by non-linearity may therefore be reduced. The controller may be operable to output the one or more candidate coefficients by: selecting them from a set of stored candidate coefficients; and/or calculating them based on the analysis; and/or estimating them based on the analysis.

In a preferred embodiment, the non-linearity evaluation circuit may comprise a storage unit operable to store the signal snapshot, wherein: the controller is operable to perform a checking operation. The checking operation may comprise applying the one or more candidate coefficients to the signal snapshot to generate a modified snapshot; analysing the modified snapshot to evaluate the non-linear characteristics of the operation of the signal generator; and based on the analysis of the modified snapshot, determining the extent to which the one or more candidate coefficients have reduced noise present in the signal snapshot due to the non-linear operation of the signal generator. The capability of candidate coefficients to reduce noise may therefore be tested.

Furthermore, the controller may be operable, if it is determined that the extent is below a threshold extent, to replace the one or more candidate coefficients with replacement one or more candidate coefficients based on the analysis of the modified signal snapshot or on the signal snapshot before the modification. Ineffective (or not sufficiently effective) candidate coefficients may therefore be replaced. The controller may also be operable to repeat said checking operation using the replacement one or more candidate coefficients.

According to an embodiment of another aspect there is provided a non-linearity compensation circuit, comprising a non-linearity evaluation circuit according to embodiments of the present invention, wherein the controller is operable to apply the candidate coefficients to the target signal or to the source signal so as to compensate for the non-linear operation of the signal generator. The non-linearity compensation circuit may further comprise the signal generator. Furthermore, the signal generator may be an analogue-to-digital converter, the source signal may be an analogue signal and the target signal may be a digital signal; or the signal generator may be a digital-to-analogue converter, the source signal may be a digital signal and the target signal may be an analogue signal. It can therefore be seen that embodiments of the present invention extend to a non-linearity evaluation circuit and a non-linearity compensation circuit, comprising a non-linearity evaluation circuit.

According to an embodiment of another aspect there is provided integrated circuitry comprising the non-linearity evaluation circuit or the non-linearity compensation circuit according to the aforementioned aspects. The integrated circuit may, for example, be a system-on-chip (SOC) circuit.

Accordingly, it may be appreciated that embodiments of the present invention may use Fourier transforms to establish or to optimise a linearity compensation. Furthermore, peak detection and Fourier transforms may be used to establish or to optimise a linearity compensation. Further still, Fourier transforms may be used to confirm correctness of analogue linearity trimming and/or to detect a wrong trimming configuration.

The present invention extends to method aspects corresponding to the apparatus aspects.

Reference will now be made, by way of example only, to the accompanying drawings, of which.

Figure 1:
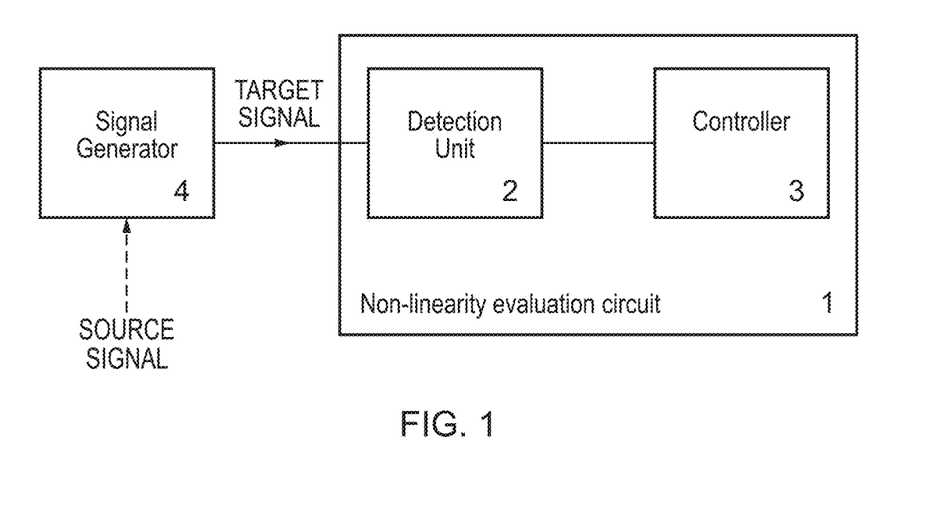
FIG. 1 is a block diagram of a nonlinearity evaluation circuit according to a general embodiment of an aspect of the invention.

FIG. 1 shows a block diagram of a non-linearity evaluation circuit according to a general embodiment of an aspect of the invention. The block diagram comprises a non-linearity evaluation circuit 1, which comprises a detection unit 2 and a controller 3. The non-linearity evaluation circuit 1 may be used with a signal generator 4, which is depicted in FIG. 1 by the connection between the signal generator 4 and detection unit 2.

The detection unit 2 detects a given amplitude attribute (such as, for example, an amplitude peak) in a target signal which may be a signal generated by the signal generator 4. The amplitude attribute may alternatively be considered as an amplitude feature, an amplitude characteristic, an amplitude phenomenon, an amplitude indicator, or an amplitude pattern, i.e. the amplitude attribute indicates a distinguishing marker, trait or quality of the target signal. As indicated, the signal generator 4 may be configured to generate the target signal based on a source signal, and may be considered as a signal converter such as an ADC or DAC (digital-to-analogue converter). Since the signal generator may be a signal converter, it will be evident that the signal generator may comprise only output(s) or both input(s) and output(s). The non-linearity evaluation circuit is applied to the output signal(s) of the signal generator (converter).

The time position/location of the attribute in the target signal defines the time location/position of a snapshot time window relative to the target signal, in which the part or segment of the target signal occupying the snapshot time window is a corresponding signal snapshot. That is, the time position of the target signal amplitude attribute establishes the time position of the snapshot time window such that the amplitude attribute and the snapshot window align and the amplitude attribute is preferably contained within the snapshot window (and thus also within the signal snapshot). The relationship between the snapshot time window and the signal is described in more detail below, with respect to FIG. 2.

The controller 3 in FIG. 1 analyses the part of the target signal that is contained within the snapshot window so as to evaluate the non-linear characteristics of the operation of the signal generator 4. Thus the non-linearity evaluation is only performed on a portion of the target signal contained within the window—the signal snapshot. In other words, a portion of the target signal captured in the snapshot window is evaluated, rather than a larger portion or even all of the target signal. The snapshot corresponds to the amplitude attribute of the target signal and so it can be seen that the amplitude attribute (or the part of the target signal having the amplitude attribute) is analysed by the controller 3.

Since only a portion of the target signal is analysed, rather h the whole target signal, or a larger part of the target signal, the required processing may be reduced and the efficiency of the non-linearity evaluation circuit 1 may be increased. Furthermore, the evaluation of non-linearity may be performed more quickly, and with less overhead, and may be performed as the target signal is received by the non-linearity evaluation circuit (i.e. on line). That is, the detection unit is operable to detect the amplitude attribute as the target signal is being received from the signal generator.

The non-linearity of the signal generator may be evident by assessing the target signal at or around the amplitude attribute, because the particular amplitude attribute is selected such that the signal snapshot will likely contain significant noise due to the non-linear operation of the signal generator. The non-linearity evaluation may therefore be more accurate and efficient as a result of performing analysis on a portion of the target signal which comprises the amplitude attribute, since the presence of the given amplitude attribute indicates that the signal snapshot includes noise due to the non-linear operation of the signal generator.

One such amplitude attribute is an amplitude peak (or trough). The term peak will be understood to encompass a trough (e.g. a negative peak), but may be applied specifically to a positive peak. It can be seen that filtering the target signal (e.g. data signal) with a peak detector (detection unit) significantly reduces the amount of data to be processed, and is a simple way to filter the target signal. Such a form of target-signal filtering is low in costs (e.g. hardware and power consumption). Less intense computation also means that a greater part of the implemented mechanism may run in software for example. It will also be appreciated that practically all types of payload (target signal) are supported using the approach of embodiments of the present invention. Requirements of the payload are discussed below, with respect to FIG. 4. Furthermore, normal operation does not have to be interrupted for calibration and so the non-linearity evaluation can be performed on line.

The amplitude attribute may comprise an amplitude peak or an amplitude trough, which may be considered an example of a given amplitude signature or amplitude pattern. For example, if the amplitude attribute is an amplitude peak, then the amplitude peak will be captured in the snapshot window and thus analysed in the non-linearity evaluation.

The data of the target signal associated with the amplitude attribute (i.e. of the signal snapshot) may be more relevant for assessing non-linearity than other parts of the target signal, and so the analysis should be focused on the amplitude attribute. For example, non-linearity of the signal generator 4 may be presented and detectable at higher signal peaks of the target signal. This may be due to the operation of electronic components, such as transistors. Generally, the operation of a transistor is linear through most of its operating range, yet, at the extremes of its operating range, a transistor is likely to exhibit non-linear behaviour. By targeting an amplitude attribute of the target signal at which the non-linearity of the components of the signal generator is likely to be present, the non-linearity may be more efficiently and accurately evaluated.

Figure 2:
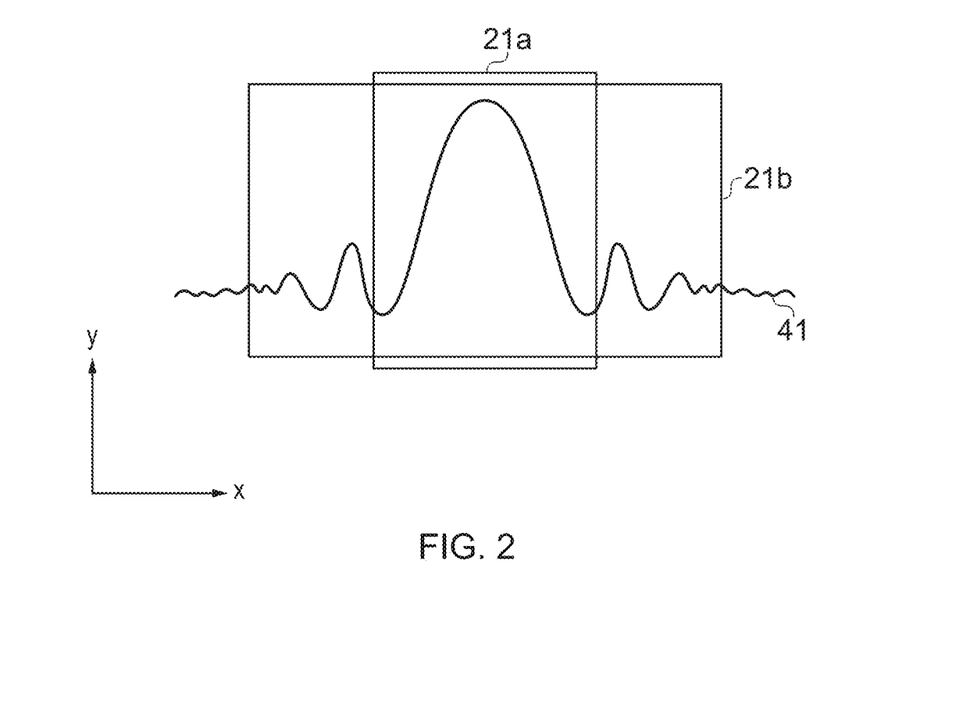
FIG. 2 is an example of a signal snapshot according to an embodiment of an aspect of the present invention.

The amount of the target signal to be analysed will be dependent on the size of the snapshot window. FIG. 2 shows an example of a target signal 41 and its relationship with two example snapshot time windows 21a, 21b. The target signal 41 comprises an amplitude attribute, which, in this example, is an amplitude peak. The two exemplary snapshot time windows 21a, 21b are aligned with the target signal 41 and, more specifically, the amplitude attribute of the target signal 41. Thus the amplitude attribute is captured within the signal snapshot, and preferably towards a middle section of the signal snapshot.

The detection unit 2 detects the amplitude attribute in the target signal and then, based on the time location of the amplitude attribute, the location of the snapshot window is defined, as shown in FIG. 2. The snapshot window is therefore positioned in time relative to the amplitude attribute and the portion or segment of the target signal contained within or occupying the snapshot window is captured as the signal snapshot and analysed to evaluate non-linearity of the signal generator, as discussed above.

The two snapshot time windows 21a, 21b have different dimensions and therefore capture different portions and amounts of the target signal 41. The size of the snapshot time window may be application dependent and may, for example, be dependent on the type of signal generator and/or target signal, the required accuracy and/or processing of the non-linearity evaluation, the size of the amplitude attribute, and/or the time location of the amplitude attribute. The detection unit 2 is operable to alter or control the size and shape of the snapshot window.

Furthermore, the detection unit may also correlate the time position of the amplitude attribute and the time position of the snapshot window so that the amplitude attribute is located in the centre of the snapshot window, particularly in the x-axis or time direction (see FIG. 2). That is, the detection unit may position the snapshot time window so that the amplitude attribute is centred within the window. This is demonstrated in FIG. 2, in which the amplitude peak (amplitude attribute) of the target signal 41 is positioned in centre of each of the snapshot time windows 21a, 21b.

Positioning the amplitude attribute in the centre of the snapshot time window may be beneficial as it ensures that an even and (substantially) equal amount of the target signal either side of the amplitude attribute is captured and analysed. Furthermore, attenuation of the amplitude attribute due to the window edge may be avoided and edge effects due to the windowing may not interfere with the amplitude attribute.

The detection unit 2 may constantly (or from time-to-time) monitor the target signal and then capture a signal snapshot when an amplitude attribute (or a "best" amplitude attribute within a monitoring period) is detected. A signal snapshot may be captured each time an amplitude attribute is detected or they may be captured less frequently, for example, as each $n^{th}$ amplitude attribute is detected. The frequency at which the signal snapshots are captured may be dependent on the target signal, on the application and/or the frequency with which the amplitude attribute is detected.

Any suitable method of detecting an amplitude attribute may be utilised by the detection unit. For example, if the amplitude attribute is an amplitude peak, any amplitude above a predetermined threshold (or the highest peak) within a time period may be determined as a detected peak. Furthermore, an amplitude peak may be detected by monitoring the gradient of the target signal. For example, a sharp gradient for an extended period would indicate a peak in the signal. Similarly, a (sharp) positive gradient for a period of time followed by a (sharp) negative gradient for a similar period of time may also indicate a peak.

The signal snapshots may be stored in a snapshot memory before being analysed. Multiple signal snapshots may be captured and stored such that they may be analysed at the same time or with respect to each other. Furthermore, multiple signal snapshots may be captured and analysed and the analysis results then averaged so that differences between the detected amplitude attributes are averaged out and a more representative evaluation of the non-linear operation may be obtained.

Figure 3:
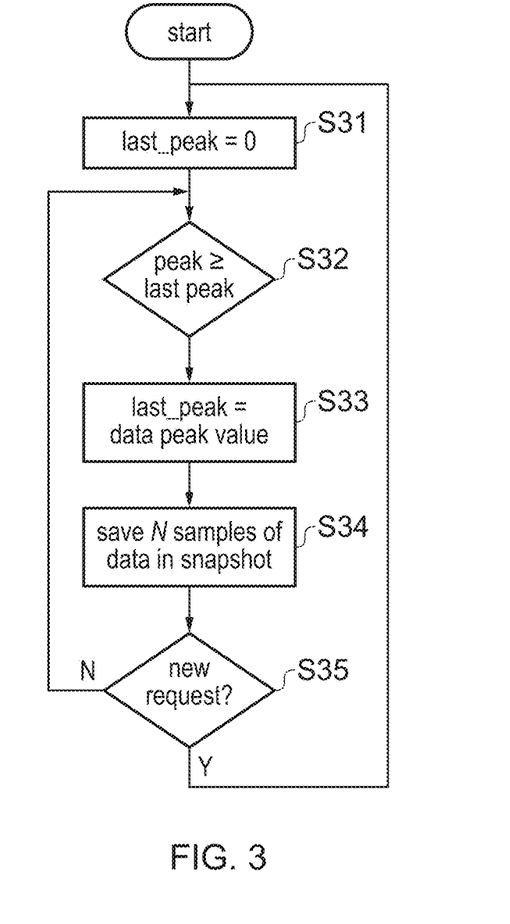
FIG. 3 is a flowchart representing a snapshot algorithm according to an embodiment of an aspect of the present invention.

FIG. 3 shows a flowchart representing a snapshot algorithm which may be used to acquire and store signal snapshots, according to an embodiment of an aspect of the present invention, in the example shown in FIG. 3, the amplitude attribute is a positive amplitude peak but the general algorithm may be applicable to the detection of any amplitude attribute, including a negative amplitude peak (i.e. the snapshot algorithm could readily be altered accordingly).

At the first step of the algorithm S31, the variable 'last_peak' is set equal to (i.e. initialised to) zero. At the next step S32 it is determined whether a peak in the target signal is bigger than the value of the variable 'last_peak'. It is evident from FIG. 3 that, due to the value of this variable being reset at step S31, any peak detected on the first loop will be greater than the value of 'last_peak'. At step S33, the value of 'last_peak' is made equal to the value of the detected peak, i.e. the detected peak value is stored as 'last_peak' such that the peak value is retained.

At step S34 data associated with the detected peak is retained by saving N samples of the relevant data. The N samples may correspond to the snapshot window such that an amount of data corresponding to a snapshot window is retained in preparation for a signal snapshot. The number N may thus be an integer corresponding to the size of the snapshot window, and this value may be controlled in some arrangements. It is then determined at step S35 whether a request for a new signal snapshot is triggered, for example, by the detection unit 2 or the controller 3. If a new signal snapshot is triggered, then the data retained in step S34 is taken as the signal snapshot data to be used in the analysis by the controller. The process then returns to step S31 and is repeated for the next signal snapshot. However, if a new signal snapshot is not triggered, then the process returns to S32 and the detection unit monitors the target signal to detect a peak value higher than the peak value stored as the variable 'last_peak'.

It can therefore be seen that the snapshot algorithm of FIG. 3 monitors the peaks of the target signal and determines whether a monitored peak is greater than the previously detected peak. When a peak is greater than the previous peak, the previous peak is replaced with the new peak so that the algorithm detects and holds data corresponding to the largest detected peak in a time period between the capture of the preceding signal snapshot and the capture of the next signal snapshot. In other words, the algorithm monitors the amplitude of the target signal over a period of time and compares each (peak) amplitude value with the largest previous (peak) amplitude value so as to determine a maximum amplitude point, which may be seen as the amplitude attribute detected by the detection unit.

It may be considered that a peak having a value less than the value of the variable 'last_peak' is not a wanted peak in the sense of the detection by the detection unit. That is, when the amplitude attribute is an amplitude peak, the detection unit 2 only detects a signal peak, as a wanted peak, when the detection criteria are fulfilled. In this case, the criteria is that the peak is larger than the previously detected peak. Any monitored signal peaks which do not fulfil the criteria may not be considered as a wanted peak by the detection unit 2.

As part of the analysis performed by the con roller 3, the controller 3 may perform spectral analysis on the portion of the target signal captured within the signal snapshot and so may transform that portion of the target signal into the frequency domain. The spectral analysis may be limited to a given frequency range and/or resolution so as to limit the required processing for the analysis. The given frequency range may be considered a range in the out-of-band spectrum, which means it is outside the spectral range of the ideally (i.e. undistorted) received power. The power which is likely to be found in the given frequency range is indicative of non-linearity in the signal generator 4. Furthermore, the frequency resolution may he related to the size of the snapshot window.

Put another way, the given frequency range may be a range in which energy present in the frequency spectrum is attributable to noise generated by the non-linear operation of the signal generator 4, rather than attributed to the wanted signal itself. For example, the signal content in the target signal may be limited in the frequency domain in a band up to frequency $f_{MAX}$, due to filtering in (e.g. at the front end of) the signal generator 4. The signal generator for example may operate based on a sampling frequency fs, and thus energy (or most of the energy) in the frequency spectrum in a band or range between $f_{MAX}$ and the Nyquist frequency, fs/2, may be attributable to noise generated by the non-linear operation of the signal generator 4. The signal generator may also operate in the frequency spectrum in a band or range between $f_{MAX}$ and $X \cdot f_{MAX}$, where $X \cdot f_{MAX} < fs/2$, and where X is a number greater than 1 (such as e.g. 2.5 or 3). Ultimately, the frequency band or range may be determined so as to capture or observe a large or substantial amount of the third harmonics of signal components.

The spectral analysis is therefore restricted to the part of the frequency spectrum in which non-linearity can most easily be identified. If multiple signal snapshots are captured for the non-linearity evaluation, the controller may perform spectral analysis on each signal snapshot independently and then average the results of the analyses.

Once the analysis has been performed and non-linearity of the signal generator evaluated, the results of the analysis may be used to correct the errors in the signal snapshot, or in the target signal in general, caused by the non-linearity of the signal generator 4. Specifically, correction coefficients may be determined to correct the target signal such that the corrected target signal has been compensated for the non-linearity present in the signal generator 4.

Figure 4:
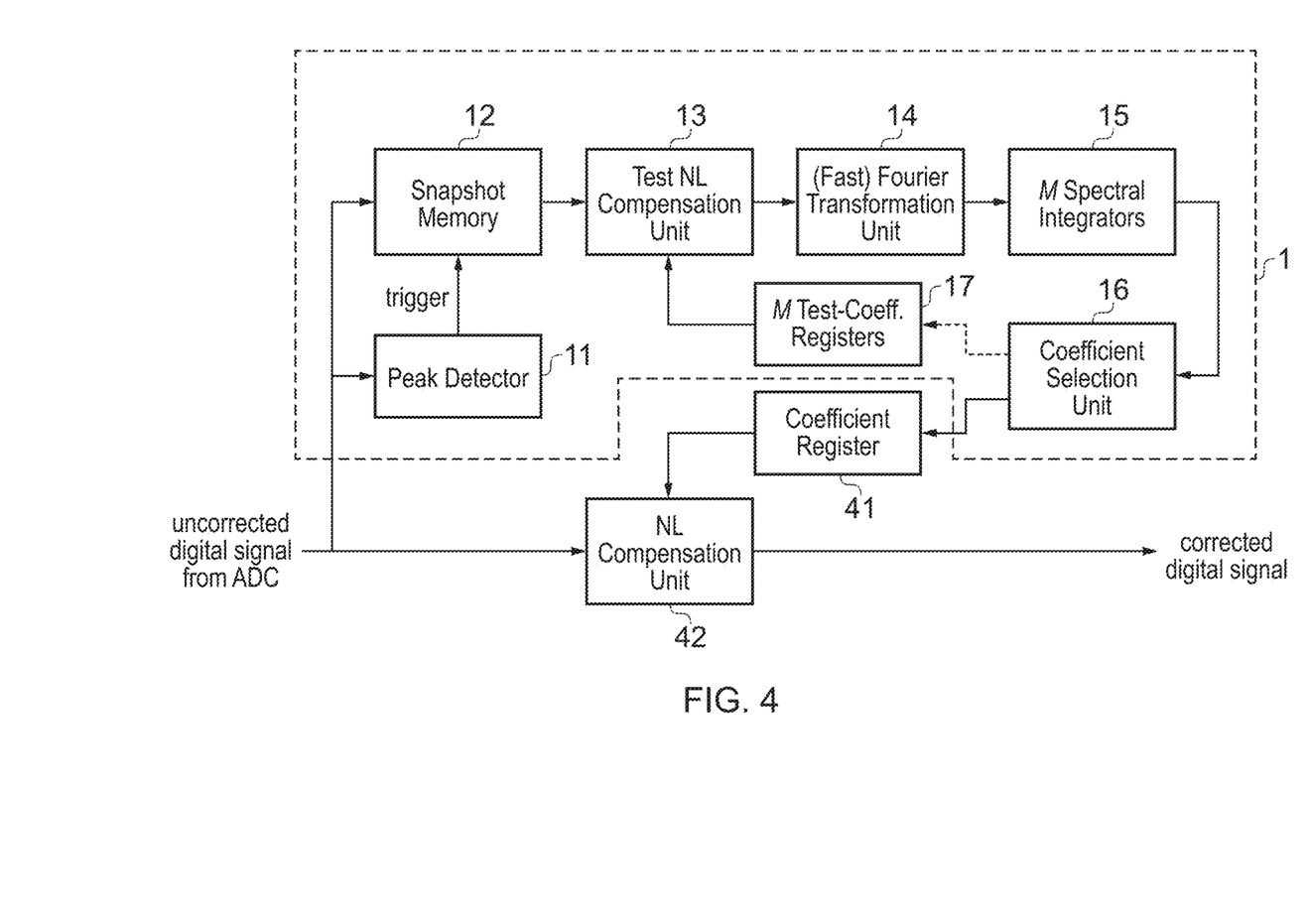
FIG. 4 is a block diagram of a non-linearity evaluation circuit according to a detailed embodiment of an aspect of the invention.

FIG. 4 is a block diagram of a non-linearity evaluation circuit according to a detailed embodiment of an aspect of the invention, in which correction coefficients are selected and tested based on the signal snapshot. In FIG. 4, the signal generator (not shown) is assumed to be an ADC and the target signal is an uncorrected digital signal output by the ADC. The output is a corrected directed signal, in which the errors/noise introduced by the non-linearity of the ADC are reduced or removed. Thus the depicted circuits aims to compensate for the non-linearity of the ADC.

The non-linearity evaluation circuit 1 comprises a peak detector 11, a snapshot memory 12, a test NL compensation unit 13 (i.e. a nonlinearity compensation unit for test), a (fast) Fourier transformation unit 14, M spectral integrators 15 (where M is an integer), a coefficient selection unit 16 and M test coefficient registers 17 (i.e. a set of coefficient registers for test). The peak detector 11 can be considered as being equivalent to the detection unit of FIG. 1, and the remaining units of FIG. 4 can be implemented by the controller 3 of FIG. 1.

The units are connected such that the uncorrected digital signal is input to the peak detector 11 and the snapshot memory 2, with the peak detector 11 providing a trigger to the snapshot memory 2 to initiate a signal snapshot. The data from the signal snapshot is provided to the test NL compensation unit 13 then to the (fast) Fourier transformation unit 14 and M spectral integrators 15. Based on the spectral analysis performed by the preceding units, the coefficient selection unit 16 selects coefficients for the correction, which are output to the M test coefficient registers 17, which are connected to the test NL compensation unit 13.

The non-linearity evaluation circuit 1 is connected to a coefficient register 41 and an NL compensation unit 42 (full-rate nonlinearity compensation unit). The coefficients output by the coefficient selection unit 16 are provided to the coefficient register 41. The coefficient register then outputs the coefficients to the NL compensation unit 42 to be applied to the uncorrected digital signal (target signal) from the ADC which is input to the NL compensation unit 42. The corrected digital signal is then output from the NL compensation unit 42.

The peak detector 11 therefore filters the data (target signal) from the ADC and triggers the snapshot memory 12. The snapshot memory 12 is able to store a specified number of consecutive samples from the data path (i.e. a signal snapshot) and is triggered based on the level of the peaks that occur in the data stream, as detected by the peak detector 11. Data with higher peaks is captured with higher preference and an exemplary algorithm is discussed above with respect to FIG. 3.

The test NL compensation unit 13 adds a correction term $c(x)$ to the signal x, such that:

$$x'=x+c(x),$$

where $c(x)$ may be a polynomial.

Mathematically, the NL compensation unit 42 and the test NL compensation unit 13 perform the same computation. However, the NL compensation unit 42 processes the full data stream, while the test NL compensation unit 13 only processes the captured signal snapshots.

In the (fast) Fourier transformation unit 14, a signal snapshot is transformed into the frequency domain. The number of samples in each transformation varies according to the ratio of the signal bandwidth fix and sampling frequency fs divided by two (fs/2). An example with $f_{MAX}=0.3*fs/2$ may use about 50 samples (i.e. N=50). If the input (target) signal is limited to a signal bandwidth of $f_{MAX}$ and the unused frequency range between $f_{MAX}$ and fs/2 is big enough (for example, ~10% of fs/2), the bandwidth of $f_{MAX}$ may be observed via a very small FFT and used for optimisation target.

In the M spectral integrators unit 15, the power in each spectral bin inside the observed band $f_{MAX}$ to fs/2 is accumulated over multiple iterations. This is done for each of the M sets of tested coefficients and the result of the M tested sets of coefficients is compared in the coefficient selection unit 16. These results are used in an optimisation scheme and the following three examples are provided:

The M sets of tested coefficients are always unchanged
  Depending on the spectral results, the optimisation scheme simply yields an interpolation of the coefficients.
A one-dimensional optimisation
  Three sets of coefficients are tested. Depending on the spectral results, the optimisation scheme yields an interpolation of the coefficients, Afterwards three new sets of coefficients are written to the Coefficient resisters.
Any other optimisation algorithm
  At each optimisation step, a new set of coefficients is written to the coefficient registers.

Thus a one-dimensional or a multi-dimensional optimisation algorithm may be used to find the optimal coefficients. The M test coefficient registers 17 and the test NL compensation unit 13 mean that one data snapshot may be used for testing multiple sets of non-linearity correction coefficients (M sets). The spectral results can then be averaged over multiple iterations to obtain more accurate coefficients.

A preferred requirement of payload is a band limitation at $f_{MAX}$. Furthermore, there may preferably be some signal energy in the band $f_{MAX}/3$ to fs/6. This is because the third harmonic should be in the observed band $f_{MAX}$ to fs/2. Some arrangements may detect a lack of signal power in this band and automatically put the optimization in a halted state.

Figure 5:
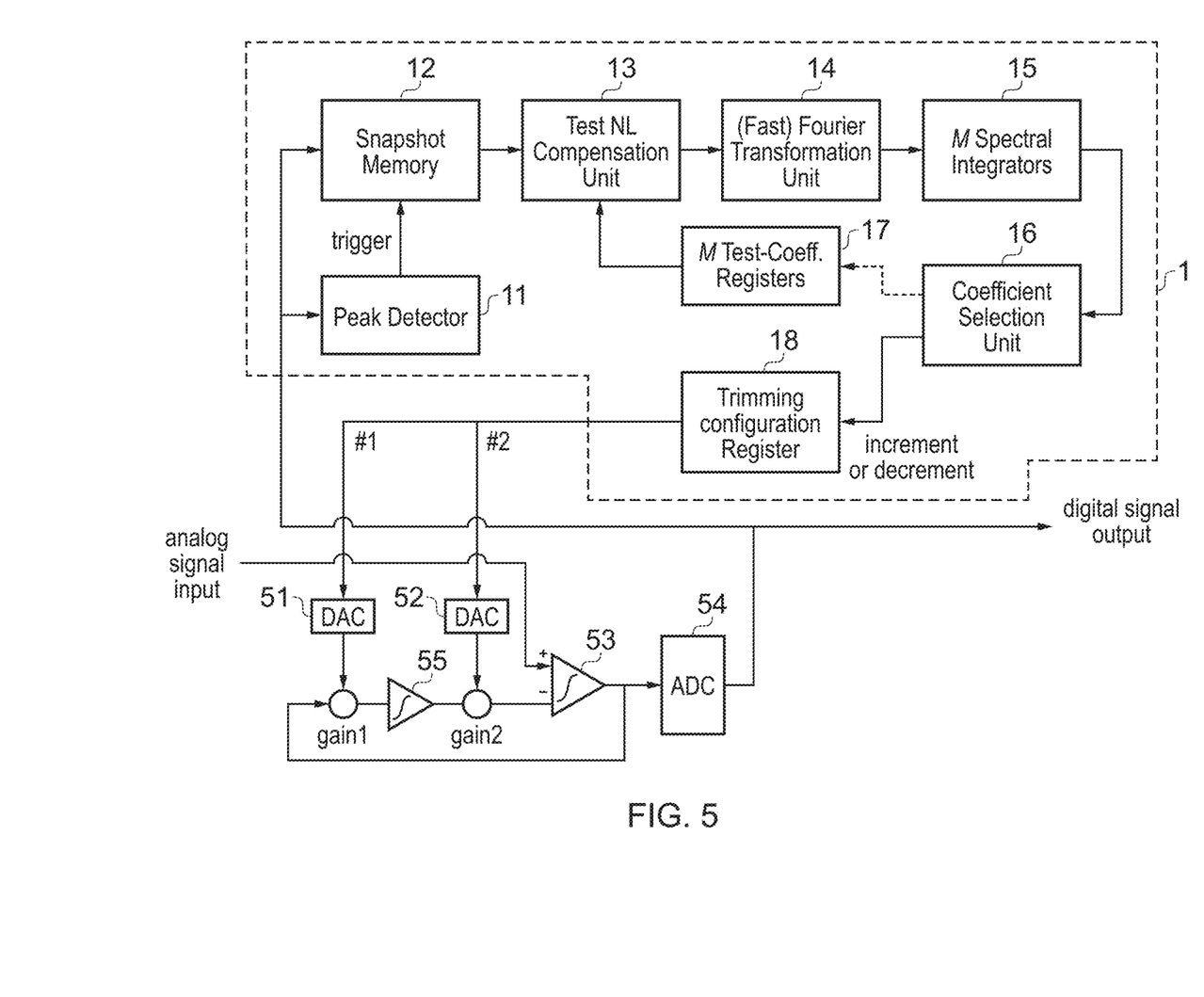
FIG. 5 is a block diagram of a non-linearity evaluation circuit according to a detailed embodiment of another aspect of the invention.

In the example shown in FIG. 4, the signal generator is an ADC which provides a digital signal to the non-linearity evaluation circuit. However, the non-linearity evaluation circuit may alternatively be used to optimise analogue trimming for linearity optimisation, as shown in the example of FIG. 5. Thus, instead of applying non-linearity compensation to the (digital) target signal, the circuit may be used to effectively pre-distort the (analogue) source signal.

FIG. 5 is a block diagram of a non-linearity evaluation circuit applied to analogue trimming according to a detailed embodiment of another aspect of the invention. The fact that the gain of the analogue trimming is not exactly known makes the evaluation of the parameters challenging. An "incremental" approach is proposed, as shown in FIG. 5. The circuit comprises an input amplifier 53 with nonlinear characteristics (saturation effect). This amplifier has a negative feedback via another nonlinear amplifier 55. This feedback has an adjustable gain at two separate points (at least one is necessary) and the gain adjustment is performed using small adjustment-DACs 51, 52.

The units of the non-linearity evaluation circuit in FIG. 5 are the same in function and operation as those in FIG. 4. However, the non-linearity evaluation circuit of FIG. 5 further comprises a trimming configuration register 18. The analogue trimmed signal, which has been converted to digital by the ADC 54 (the signal generator), can be seen as the target signal which is input to the non-linearity evaluation circuit and it is from this signal that all snapshots are drawn. The snapshots are again compensated with at least two different coefficients, for example a slightly negative and a slightly positive correction. By comparing the two results after the spectral integration it will be known if the analogue trimming parameter should be slightly "lower" or "higher". The trimming configuration register 18 instructs the small adjustment-DACs 51, 52 to set the analogue trimming parameters in the feedback loop. The example in FIG. 5 may also be utilised to determine whether applied trimming is correct or incorrect.

It will be appreciated that he overall circuitry disclosed herein could be described as a signal processor, signal generator, or signal converter. The circuitry of FIG. 4 could be referred to as a non-linearity compensation circuit (also if the ADC—not shown—were included). The circuitry of FIG. 5 could also be referred to as a non-linearity compensation circuit (also if the ADC were not included).

Circuitry of the present invention may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

Figure 6:
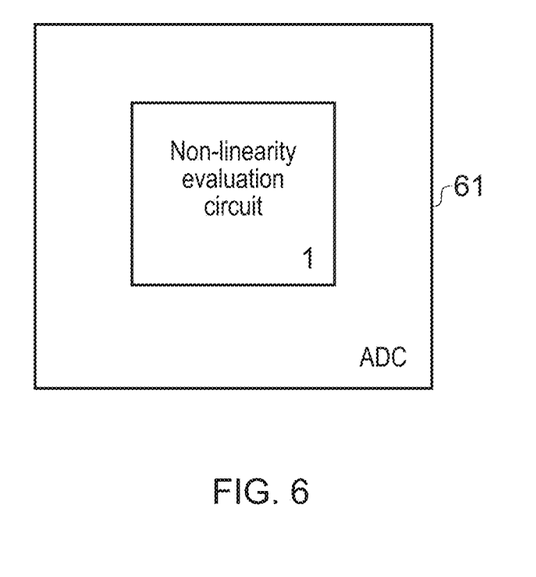
FIG. 6 is a block diagram of a system-on-chip integrated circuit comprising a non-linearity evaluation circuit according to an embodiment of an aspect of the invention.

FIG. 6 is a block diagram of an analogue-to-digital converter (ADC) circuit 61 comprising a non-linear evaluation circuit 1 according to an embodiment of an aspect of the invention. The non-linear evaluation circuit 1 may be provided as part of an ADC as shown in FIG. 6, or may be provided as part of any integrated circuit, system-on-chip, signal processor, converter, amplifier, analogue or digital circuit which exhibits, or potentially exhibits, non-linear behaviour.

In any of the above aspects, the various features may be implemented in hardware, or as software modules running on one or more processors as appropriate. Features of one aspect may be applied to any of the other aspects.

The invention also provides a computer program or a computer program product for carrying out any of the methods described herein, and a computer readable medium having stored thereon a program for carrying out any of the methods described herein, A computer program embodying the invention may be stored on a computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The invention claimed is:

1. A non-linearity evaluation circuit for use with a signal generator having at least partly non-linear operation, the non-linearity evaluation circuit comprising:
    a detection unit operable to detect a given amplitude attribute in a target signal generated by the signal generator, a time position of the amplitude attribute in the target signal defining a time location of a snapshot time window relative to the target signal, a part of the target signal occupying the snapshot time window being a corresponding signal snapshot, a presence of the given amplitude attribute indicating that the signal snapshot includes noise due to the non-linear operation of the signal generator, and the given amplitude attribute comprising an amplitude peak or an amplitude trough; and
    a controller operable to analyse the signal snapshot rather than a larger part of the target signal and to evaluate the non-linear characteristics of the operation of the signal generator based on the analysis.

2. The non-linearity evaluation circuit as claimed in claim 1, wherein:
    the given amplitude attribute comprises a given amplitude signature or amplitude pattern; or
    the amplitude attribute occurs within a given range of amplitude values.

3. The non-linearity evaluation circuit as claimed in claim 1, wherein the controller is operable to control a time relationship between the time location of the snapshot time window and the time position of the amplitude attribute in the target signal,
    optionally wherein the controller is operable to control the time relationship such that the snapshot time window contains the amplitude attribute, preferably in a middle section of the snapshot time window.

4. The non-linearity evaluation circuit as claimed in claim 1, wherein the controller is operable to control the size of the snapshot time window.

5. The non-linearity evaluation circuit as claimed in claim 1, wherein the controller is operable in the analysis to perform spectral analysis on the signal snapshot, rather than over the larger part of the target signal, so as to evaluate said non-linear characteristics.

6. The non-linearity evaluation circuit as claimed in claim 5, wherein the controller is operable to perform the spectral analysis over a given frequency range rather than over a larger frequency range.

7. The non-linearity evaluation circuit as claimed in claim 6, wherein the given frequency range is a range over which energy in the resultant spectrum is indicative of the noise in the target signal due to the non-linear operation of the signal generator.

8. The non-linearity evaluation circuit as claimed in claim 6, wherein:
    the target signal has a signal bandwidth of $f_{MAX}$, where $f_{MAX} < fs/2$, and where fs is a sampling frequency based on which the signal generator generated the target signal; and
    the given frequency range is between $f_{MAX}$ and fs/2.

9. The non-linearity evaluation circuit as claimed in claim 8, wherein:
    $f_{MAX}$ and fs are defined such that $(fs/2 - f_{MAX}) > fs/20$; or the given frequency range is between $f_{MAX}$ and $X \cdot f_{MAX}$, where $X \cdot f_{MAX} < fs/2$, and where $X > 1$; or
    the given frequency range is a subrange of the range between $f_{MAX}$ and fs/2.

10. The non-linearity evaluation circuit as claimed in claim 1, further comprising:
    a snapshot memory operable to store a plurality of said signal snapshots, wherein:
    the controller is operable to perform spectral analysis on each of the stored signal snapshots to obtain a plurality of spectral results, to determine an average spectral result from the plurality of spectral results, and to evaluate said non-linear characteristics based on the average spectral result,
    optionally wherein:
    the snapshot memory is operable to store a plurality of average spectral results; and
    the controller is operable to evaluate said non-linear characteristics based on the plurality of average spectral results.

11. The non-linearity evaluation circuit as claimed in claim 1, wherein the controller is operable, based on the analysis of the signal snapshot, to output one or more candidate coefficients which, when applied to the signal snapshot or to a corresponding part of a source signal of the signal generator based on which the target signal was generated, would reduce noise present in the signal snapshot due to the non-linear operation of the signal generator.

12. The non-linearity evaluation circuit as claimed in claim 11, wherein the controller is operable to output the one or more candidate coefficients by:
    selecting them from a set of stored candidate coefficients; or
    calculating them based on the analysis; or
    estimating them based on the analysis.

13. The non-linearity evaluation circuit as claimed in claim 11, comprising a storage unit operable to store the signal snapshot, wherein:
    the controller is operable to perform a checking operation comprising:
        applying the one or more candidate coefficients to the signal snapshot to generate a modified snapshot;
        analyzing the modified snapshot to evaluate the non-linear characteristics of the operation of the signal generator; and
        based on the analysis of the modified snapshot, determining the extent to which the one or more candidate coefficients have reduced noise present in the signal snapshot due to the non-linear operation of the signal generator.

14. The non-linearity evaluation circuit as claimed in claim 13, wherein the controller is operable, if it is determined that the extent is below a threshold extent, to replace the one or more candidate coefficients with replacement one or more candidate coefficients based on the analysis of the modified signal snapshot or on the signal snapshot before the modification,     optionally wherein the controller is operable to repeat said checking operation using the replacement one or more candidate coefficients.

15. A non-linearity compensation circuit, comprising the non-linearity evaluation circuit as claimed in claim 11, wherein the controller is operable to apply the candidate coefficients to the target signal or to the source signal so as to compensate for the non-linear operation of the signal generator.

* * * * *